United States Patent
Lee

(10) Patent No.: US 8,036,046 B2
(45) Date of Patent: Oct. 11, 2011

(54) DATA OUTPUT CIRCUIT AND METHOD

(75) Inventor: Kang-Youl Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 470 days.

(21) Appl. No.: 12/344,017

(22) Filed: Dec. 24, 2008

(65) Prior Publication Data

US 2010/0110800 A1    May 6, 2010

(30) Foreign Application Priority Data

Nov. 4, 2008    (KR) .................. 10-2008-0109002

(51) Int. Cl.
*G11C 5/14*    (2006.01)

(52) U.S. Cl. ............................. 365/189.05; 365/189.17

(58) Field of Classification Search ............. 365/189.05, 365/189.17, 194, 230.08
See application file for complete search history.

(56) References Cited

U.S. PATENT DOCUMENTS

2003/0147299 A1* 8/2003 Setogawa .................. 365/233

FOREIGN PATENT DOCUMENTS

KR    1020070080455 A    8/2007
KR    1020080001977 A    1/2008

OTHER PUBLICATIONS

Notice of Allowance issued from Korean Intellectual Property Office on Apr. 28, 2010.

* cited by examiner

*Primary Examiner* — Vu Le
(74) *Attorney, Agent, or Firm* — IP & T Group LLP

(57) ABSTRACT

A data output circuit includes a strobe signal controlling block configured to generate a first delayed strobe signal by delaying a first strobe signal by a certain delay amount, an input/output sense amplifying block configured to amplify first parallel data signals to generate second parallel data signals having the same number of bits as that of the first parallel data signals in response to the first strobe signal and the first delayed strobe signal, a storing block configured to latch the second parallel data signals in response to a second strobe signal and a second delayed strobe signal, and a parallel-to-serial converting block configured to sequentially output the second parallel data signals latched in the storing block, wherein the first strobe signal is used to generate a data signal that is outputted first among the second parallel data signals.

17 Claims, 9 Drawing Sheets

DATA OUTPUT CIRCUIT AND METHOD

CROSS-REFERENCE TO RELATED APPLICATIONS

The present invention claims priority of Korean patent application number 10-2008-0109002, filed on Nov. 4, 2008, which is incorporated by reference in its entirety.

BACKGROUND OF THE INVENTION

The present invention relates to a circuit and method for outputting data, and more particularly, to a circuit and method capable of outputting data at a high speed.

In order to enhance an operational speed of a synchronous semiconductor memory device such as a synchronous dynamic random access memory (SDRAM) device, data stored in a memory core are read out by N bits in parallel at one time in response to a read command and the data are prefetched before being outputted in series through each output pin DQ. This prefetch scheme can be extended to a 2-bit prefetch scheme where 2-bit data are stored for each output pin DQ in advance as well as a 4-bit prefetch or 8-bit prefetch scheme where 4-bit or 8-bit data are stored in advance.

FIG. 1 illustrates a diagram of a conventional data output circuit. Specially, FIG. 1 shows a diagram of a data output circuit of a synchronous semiconductor memory device reading out data in a 4-bit prefetch scheme for one output pin DQ.

The conventional data output circuit includes an input/output sense amplifying block 101, a storing block 111 and a parallel-to-serial converting block 129.

First parallel data signals DATA1/B to DATA4/B sensed and amplified at bit line sense amplifiers (not shown) are inputted to the input/output sense amplifying block 101 through 4 pairs of main/sub local input/output lines LIO_1/B to LIO_4/B, wherein the input/output sense amplifying block 101 includes a plurality of input/output sense amplifiers 103, 105, 107 and 109. The input/output sense amplifying block 101 amplifies the first parallel data signals DATA1/B to DATA4/B in response to a first strobe signal STRB_1 generated by delaying a column selection signal YI by a certain delay amount and outputs second parallel data signals D1 to D4 to global input/output lines GIO_1 to GIO_4. Since data signals transmitted through one pair of main/sub local input/output lines correspond to data signals transmitted through one global input/output line, each of the first parallel data signals DATA1/B to DATA4/B and the second parallel data signals D1 to D4 may include 4 bits.

The storing block 111 includes a plurality of pass gates 113, 115, 117 and 119 and a plurality of latching elements 121, 123, 125 and 127. The plurality of pass gates 113, 115, 117 and 119 is turned on/off in response to a second strobe signal STRB_2 and transfers the second parallel data signals D1 to D4 transmitted through the global input/output lines GIO_1 to GIO_4 to the plurality of latching elements 121, 123, 125 and 127. The storing block 111 uses the second strobe signal STRB_2 to secure a timing margin between the second parallel data signals D1 to D4 and a signal activating the storing block 111. The second strobe signal STRB_2 may be generated by delaying the first strobe signal STRB_1 using a delay unit (not shown). The delay unit delays the first strobe signal STRB_1 by a delay amount in the transmission of the second parallel data signals D1 to D4 in response to the first strobe signal STRB_1 from the input/output sense amplifying block 101 to the storing block 111.

Since the plurality of latching elements 121, 123, 125 and 127 stores the second parallel data signals D1 to D4 although the plurality of pass gates 113, 115, 117 and 119 is turned off, the parallel-to-serial converting block 129 can sequentially output the second parallel data signals D1 to D4.

The parallel-to-serial converting block 129 outputs the second parallel data signals D1 to D4 in output order determined in response to an output control signal ORDER_CTRL. For instance, in the parallel-to-serial converting block 129, the second parallel data signals D1 to D4 may be outputted in order of D1, D2, D3 and D4 if the output control signal ORDER_CTRL is 00; in order of D4, D1, D2 and D3 if the output control signal ORDER_CTRL is 01; in order of D3, D4, D1 and D2 if the output control signal ORDER_CTRL is 10; and in order of D2, D3, D4 and D1 if the output control signal ORDER_CTRL is 11.

Also, the parallel-to-serial converting block 129 sequentially outputs the second parallel data signals D1 to D4 after an address access time tAA passes from a point of time where a read command is inputted from the outside of the synchronous semiconductor memory device in response to a CAS latency signal CL_CTRL including information for CAS latency CL. The CAS latency CL represents the number of clock cycles required until data signals are outputted to the outside of the synchronous semiconductor memory device after the read command is inputted and it may be set in a mode register set (MRS). The address access time tAA means a time taken until a first data signal is outputted to the outside of the synchronous semiconductor memory device after the read command is inputted. Therefore, if the address access time tAA is 16 ns and one clock cycle is 3 ns, the CAS latency CL may be equal to or greater than 6.

FIG. 2 illustrates a timing diagram of the data output circuit described in FIG. 1 in case the CAS latency CL is 6 and the parallel-to-serial converting block 129 outputs the second parallel data signals D1 to D4 in order of D1, D2, D3 and D4.

If the column selection signal YI is enabled after the read command is inputted, there occurs a potential difference between the main/sub local input/output lines LIO_1/B to LIO_4/B that are precharged to a logic high level when the first parallel data signals DATA1/B to DATA4/B sensed and amplified at the bit line sense amplifiers are loaded onto the 4 pairs of main/sub local input/output lines LIO_1/B to LIO_4/B. The input/output sense amplifying block 101 senses and amplifies the potential difference between the main/sub local input/output lines LIO_1/B to LIO_4/B in response to the first strobe signal STRB_1 and outputs the second parallel data signals D1 to D4 onto the global input/output lines GIO_1 to GIO_4. For instance, if the potential of the first main local input/output line LIO_1 transits to a logic low level, the second parallel data signal D1 of the first global input/output line GIO_1 transits to a logic high level. If the potential of the first sub local input/output line LIO_1B transits to a logic low level, the second parallel data signal D1 of the first global input/output line GIO_1 transits to a logic low level.

The storing block 111 latches the second parallel data signals D1 to D4 in response to the second strobe signal STRB_2. The parallel-to-serial converting block 129 sequentially outputs the second parallel data signals D1 to D4 in order of D1, D2, D3 and D4 after clock cycles corresponding to the CAS latency CL, that is 6, in response to the output control signal ORDER_CTRL.

FIG. 3 illustrates a waveform diagram of the data signals transmitted through the global input/output lines described in FIG. 1.

Although FIG. 1 describes only 4 global input/output lines GIO_1 to GIO_4, in case a synchronous semiconductor memory device has 16 output pins DQ and processes data using a 4-bit prefetch scheme, the semiconductor memory device includes 16*4 global input/output lines. As illustrated in FIG. 3, in case only the data signal transmitted through the global input/output line GIO_1 transits from a logic high level to a logic low level, the coupling may occur between the data signal transmitted through the global input/output line GIO_1 and the data signals transmitted through the global input/output lines GIO_2 and GIO_5 adjacent to the global input/output line GIO_1 that transit from a logic low level to a logic high level, so that the data signal transmitted through the global input/output line GIO_1 may be delayed by a first delay amount DD_1 due to simultaneous switching noise (SSN).

Therefore, in case the second parallel data signal D1 is first outputted from the parallel-to-serial converting block 129, the conventional data output circuit increases the address access time tAA representing an important operational property of the synchronous semiconductor memory device, and thus may deteriorate a high speed operational property of the synchronous semiconductor memory device and erroneously output undesired data signals by the delay of the data signals.

SUMMARY OF THE INVENTION

Embodiments of the present invention are directed to provide a data output circuit and method capable of preventing an erroneous operation due to the delay of data signals and improving an address access time tAA.

In accordance with an aspect of the present invention, there is provided a data output circuit including: a strobe signal controlling block configured to generate a delayed strobe signal by delaying a strobe signal by a certain delay amount; an input/output sense amplifying block configured to amplify first parallel data signals to generate second parallel data signals having the same bit number as that of the first parallel data signals in response to the strobe signal and the delayed strobe signal; a storing block configured to latch the second parallel data signals in response to the strobe signal and the delayed strobe signal; and a parallel-to-serial converting block configured to sequentially output the second parallel data signals latched in the storing block, wherein a data signal, which corresponds to the strobe signal, among the second parallel data signals is first and foremost outputted.

In accordance with another aspect of the present invention, there is provided a data output circuit including: a strobe signal controlling block configured to delay a strobe signal by a certain delay amount, thereby generating at least one delayed strobe signal that is sequentially enabled; an input/output sense amplifying block configured to amplify first parallel data signals to generate second parallel data signals having the same bit number as that of the first parallel data signals in response to the strobe signal and the at least one delayed strobe signal; a storing block configured to latch the second parallel data signals in response to the strobe signal and the at least one delayed strobe signal; and a parallel-to-serial converting block configured to sequentially output the second parallel data signals latched in the storing block in the order of the second parallel data signals being latched.

In accordance with still another aspect of the present invention, there is provided a data output circuit including: a strobe signal controlling block configured to delay a strobe signal by a certain delay amount according to the output order of data signals determined in response to an output control signal, thereby generating a plurality of delayed strobe signals; an input/output sense amplifying block configured to amplify first parallel data signals to generate second parallel data signals having the same bit number as that of the first parallel data signals in response to the strobe signal and the delayed strobe signals; a storing block configured to latch the second parallel data signals in response to the strobe signal and the delayed strobe signals; and a parallel-to-serial converting block configured to sequentially output the second parallel data signals latched in the storing block in response to the output control signal.

In accordance with a further aspect of the present invention, there is provided a data output circuit including: a strobe signal controlling block configured to delay a strobe signal by a certain delay amount according to the output order of data signals determined in response to an output control signal, thereby generating at least one delayed strobe signal; an input/output sense amplifying block configured to amplify first parallel data signals to generate second parallel data signals having the same bit number as that of the first parallel data signals in response to the strobe signal and the at least one delayed strobe signal; a storing block configured to latch the second parallel data signals in response to the strobe signal and the at least one delayed strobe signal; and a parallel-to-serial converting block configured to sequentially output the second parallel data signals latched in the storing block in response to the output control signal.

In accordance with a further still another aspect of the present invention, there is provided a data output method including: generating a delayed strobe signal by delaying a strobe signal by a certain delay amount according to the output order of data signals determined in response to an output control signal; amplifying first parallel data signals in response to the strobe signal and the delayed strobe signal, thereby generating second parallel data signals having the same bit number as that of the first parallel data signals; latching the second parallel data signals in response to the strobe signal and the delayed strobe signal; and sequentially outputting the latched second parallel data signals in response to the output control signal.

DESCRIPTION OF SPECIFIC EMBODIMENTS

Other objects and advantages of the present invention can be understood by the following description, and become apparent with reference to the embodiments of the present invention.

Figure 4:
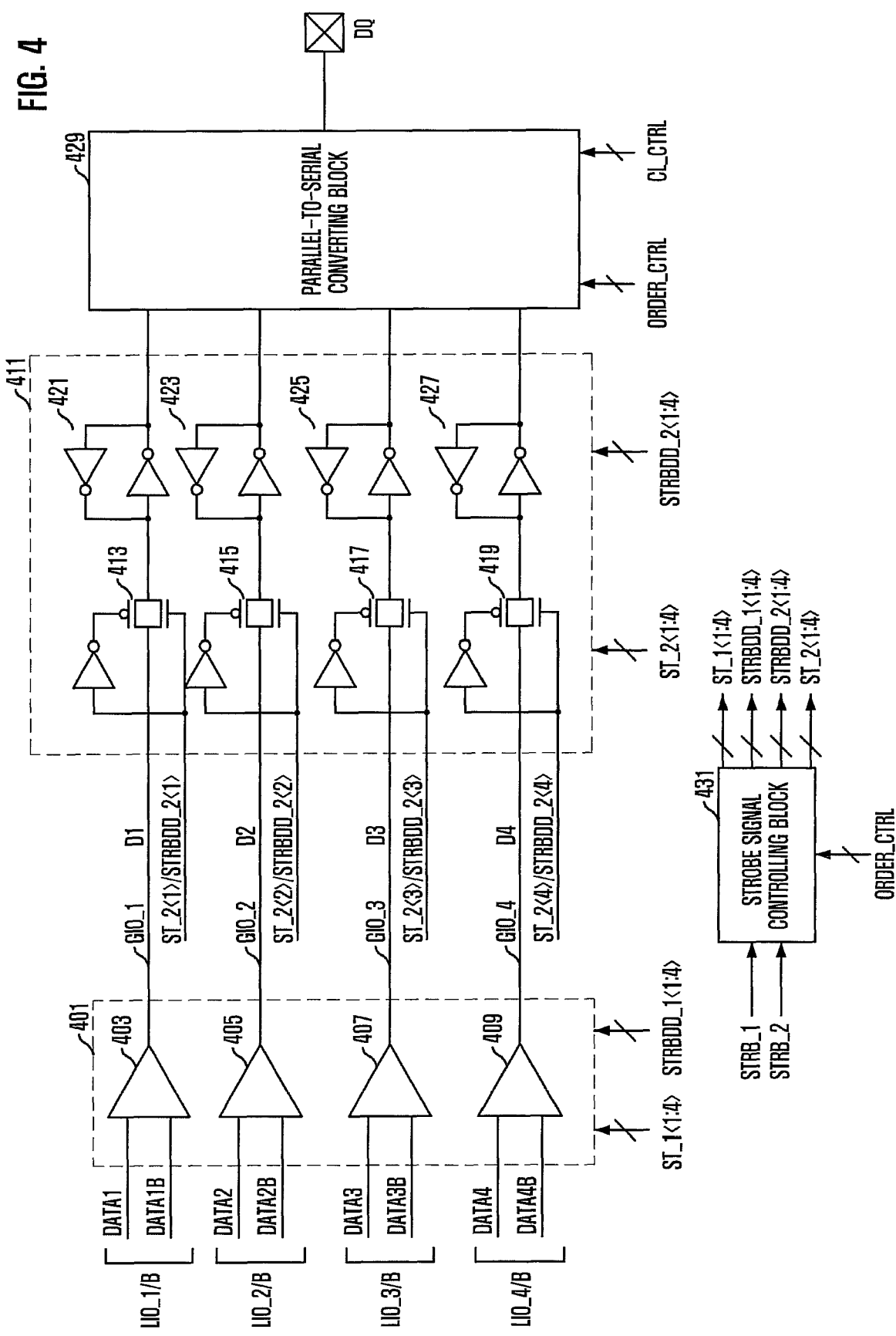
FIG. 4 illustrates a diagram of a data output circuit in accordance with an embodiment of the present invention.

FIG. 4 illustrates a diagram of a data output circuit in accordance with an embodiment of the present invention.

Referring to FIG. 4, the data output circuit includes an input/output sense amplifying block 401, a storing block 411, a parallel-to-serial converting block 429 and a strobe signal controlling block 431. Hereinafter, a data output circuit of a synchronous semiconductor memory device processing data signals using a 4-bit prefetch scheme will be described as one embodiment of the present invention. It will be apparent to those skilled in the art that the present invention is applicable to a data output circuit processing data signals using other prefetch scheme instead of the 4-bit prefetch scheme.

First, parallel data signals DATA1/B to DATA4/B sensed and amplified at bit line sense amplifiers (not shown) are inputted to the input/output sense amplifying block 401 through 4 pairs of main/sub local input/output lines LIO_1/B to LIO_4/B, wherein the input/output sense amplifying block 401 includes a plurality of input/output sense amplifiers 403, 405, 407 and 409.

The strobe signal controlling block 431 outputs a first strobe control signal ST_1<1:4> and a first delayed strobe signal STRBDD_1<1:4> obtained by delaying a first strobe signal STRB_1 by a second delay amount DD_2 according to the data output order in the parallel-to-serial converting block 429 determined in response to an output control signal ORDER_CTRL, wherein the first strobe control signal ST_1<1:4> has the same enable timing as that of the first strobe signal STRB_1. The first strobe signal STRB_1 is generated by delaying a column selection signal YI by a certain delay amount.

The input/output sense amplifying block 401 amplifies the first parallel data signals DATA1/B to DATA4/B in response to the first strobe control signal ST_1<1:4> and the first delayed strobe signal STRBDD_1<1:4> and outputs second parallel data signals D1 to D4 onto global input/output lines GIO_1 to GIO_4. The first strobe control signal ST_1<1:4> corresponds to a data signal first outputted from the parallel-to-serial converting block 429 and the first delayed strobe signal STRBDD_1<1:4> corresponds to data signals except the data signal first outputted from the parallel-to-serial converting block 429. The data signals except the data signal first outputted from the parallel-to-serial converting block 429 may be transmitted after being delayed by the second delay amount DD_2 since they have a sufficient margin until being outputted compared to the data signal first outputted from the parallel-to-serial converting block 429.

For instance, in case the second parallel data signals D1 to D4 are outputted in order of D1, D2, D3 and D4 that is determined in response to an output control signal ORDER_CTRL in the parallel-to-serial converting block 429, the first input/output sense amplifier 403 of the input/output sense amplifying block 401 outputs the second parallel data signal D1 in response to the first strobe control signal ST1<1> and the second to the fourth input/output sense amplifiers 405, 407 and 409 output the second parallel data signals D2 to D4 in response to the first delayed strobe signals STRBDD_1<2:4> after a time corresponding to the second delay amount DD_2 passes compared to the first input/output sense amplifier 403.

In case the second parallel data signals D1 to D4 are outputted in order of D4, D1, D2 and D3 in the parallel-to-serial converting block 429, the fourth input/output sense amplifier 409 outputs the second parallel data signal D4 in response to the first strobe control signal ST_1<4> and the first to the third input/output sense amplifiers 403, 405 and 407 output the second parallel data signals D1 to D3 in response to the first delayed strobe signals STRBDD_1<1:3> after a time corresponding to the second delay amount DD_2 passes compared to the fourth input/output sense amplifier 409.

Therefore, since the inventive data output circuit can prevent the second parallel data signal D1 from being delayed by the simultaneous switching noise (SSN) until the second parallel data signals D1 to D4 are transmitted through the global input/output lines GIO_1 to GIO_4 and outputted through the parallel-to-serial converting block 429, the address access time tAA of the synchronous semiconductor memory device can be improved and it is possible to synchronize exact data signals with a clock CLK and output the data signals. At this time, the second delay amount DD_2 may be equal to or greater than a width of an edge period (e.g., a transition period in switching logic states of a signal) of the parallel data signals D1 to D4 in order to minimize the SSN.

A detailed operation of the strobe signal controlling block 431 will be described with reference to FIG. 5.

The storing block 411 includes a plurality of pass gates 413, 415, 417 and 419 and a plurality of latching elements 421, 423, 425 and 427. The plurality of pass gates 413, 415, 417 and 419 is turned on/off in response to a second delayed strobe signal STRBDD_2<1:4> and a second strobe control signal ST_2<1:4> outputted from the strobe signal controlling block 431 and transfers the second parallel data signals D1 to D4 having different transmission timing by the second delay amount DD_2 to the plurality of latching blocks 421, 423, 425 and 427. The storing block 411 uses the second delayed strobe signal STRBDD_2<1:4> and the second strobe control signals ST_2<1:4> generated based on a second strobe signal STRB_2 to secure a timing margin between the second parallel data signals D1 to D4 and a signal activating the storing block 411. The second strobe signal STRB_2 may be generated by delaying the first strobe signal STRB_1 using a delay unit (not shown) and the delay unit delays the first strobe signal STRB_1 by a delay amount in transmitting the second parallel data signals D1 to D4 in response to an application of the first strobe signal STRB_1 from the input/output sense amplifying block 401 to the storing block 411.

The strobe signal controlling block 431 receives the second strobe signal STRB_2 and outputs the second strobe control signal ST_2<1:4> and the second delayed strobe signal STRBDD_2<1:4>. The second strobe control signal ST_2<1:4> has the same enable timing as that of the second strobe signal STRB_2, and the second delayed strobe signal STRBDD_2<1:4> is a signal delayed by the second delay amount DD_2 compared to the second strobe signal STRB_2. The second strobe control signal ST_2 corresponds to a data signal first outputted from the parallel-to-serial converting block 429 and the second delayed strobe signal STRBDD_2 corresponds to data signals except the data signal first outputted from the parallel-to-serial converting block 429.

For example, in case the second parallel data signals D1 to D4 are outputted in order of D1, D2, D3 and D4 determined in response to the output control signal ORDER_CTRL in the parallel-to-serial converting block 429, the first pass gate 413 is turned on in response to the second strobe control signal ST_2<1> and the second to the fourth pass gates 415, 417 and 419 are turned on in response to the second delayed strobe signal STRBDD_2<2:4>.

The plurality of latching elements 421, 423, 425 and 427 stores the second parallel data signals D1 to D4 although the plurality of pass gates 413, 415, 417 and 419 are turned off, thereby allowing the parallel-to-serial converting block 429 to sequentially output the second parallel data signals D1 to D4.

The parallel-to-serial converting block 429 outputs the second parallel data signals D1 to D4 in an order determined in response to the output control signal ORDER_CTRL.

Figure 1:
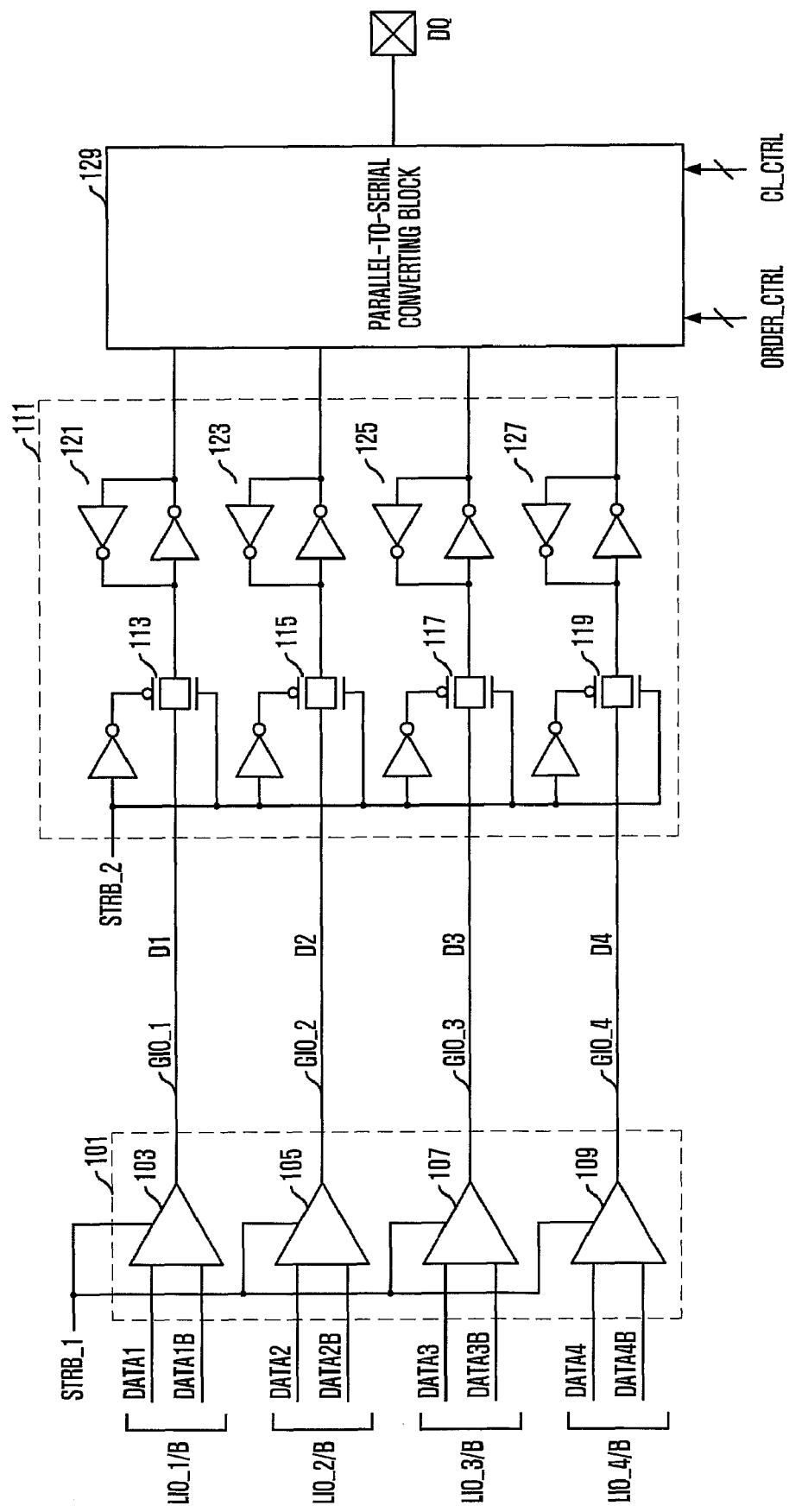
FIG. 1 illustrates a diagram of a conventional data output circuit.

For instance, as described in FIG. 1, in case the output control signal ORDER_CTRL is 00, the second parallel data signals D1 to D4 are outputted in order of D1, D2, D3 and D4 in the parallel-to-serial converting block 429. Meanwhile, in case the output control signal ORDER_CTRL is 01, the second parallel data signals D1 to D4 are outputted in order of D4, D1, D2 and D3 in the parallel-to-serial converting block 429.

The parallel-to-serial converting block 429 sequentially outputs the second parallel data signals D1 to D4 after clock cycles corresponding to CAS latency CL pass from a point of time where a read command is inputted from the outside of the synchronous semiconductor memory device in response to a CAS latency signal CL_CTRL including information for the CAS latency CL.

The data output circuit described in FIG. 4 shows the embodiment where the data output circuit is used in the semiconductor memory device, but the data output circuit in accordance with the embodiment of the present invention can be applied to any data transmission system using a scheme similar to the prefetch scheme.

Further, the data output circuit described in FIG. 4 illustrates a case of the data output order being determined by the output control signal provided externally, but the embodiment of the present invention can also be applied to a data output circuit outputting data according to the preset data output order. In this case, the strobe signal controlling block 431 does not respond to the output control signal ORDER_CTRL and delays a strobe signal used to output the data signals except the data signal first outputted from the parallel-to-serial converting block 429. For instance, in case the data output order preset in the parallel-to-serial converting block 429 is D4, D1, D2 and D3, the fourth input/output sense amplifier 409 always receives the first strobe control signal ST_1 and the first to the third input/output sense amplifiers 403, 405 and 407 always receive the first delayed strobe control signal STRBDD_1. The storing block 411 also receives the second delayed strobe control signals STRBDD_2 and the second strobe control signal ST_2 determined as described above.

Figure 5:
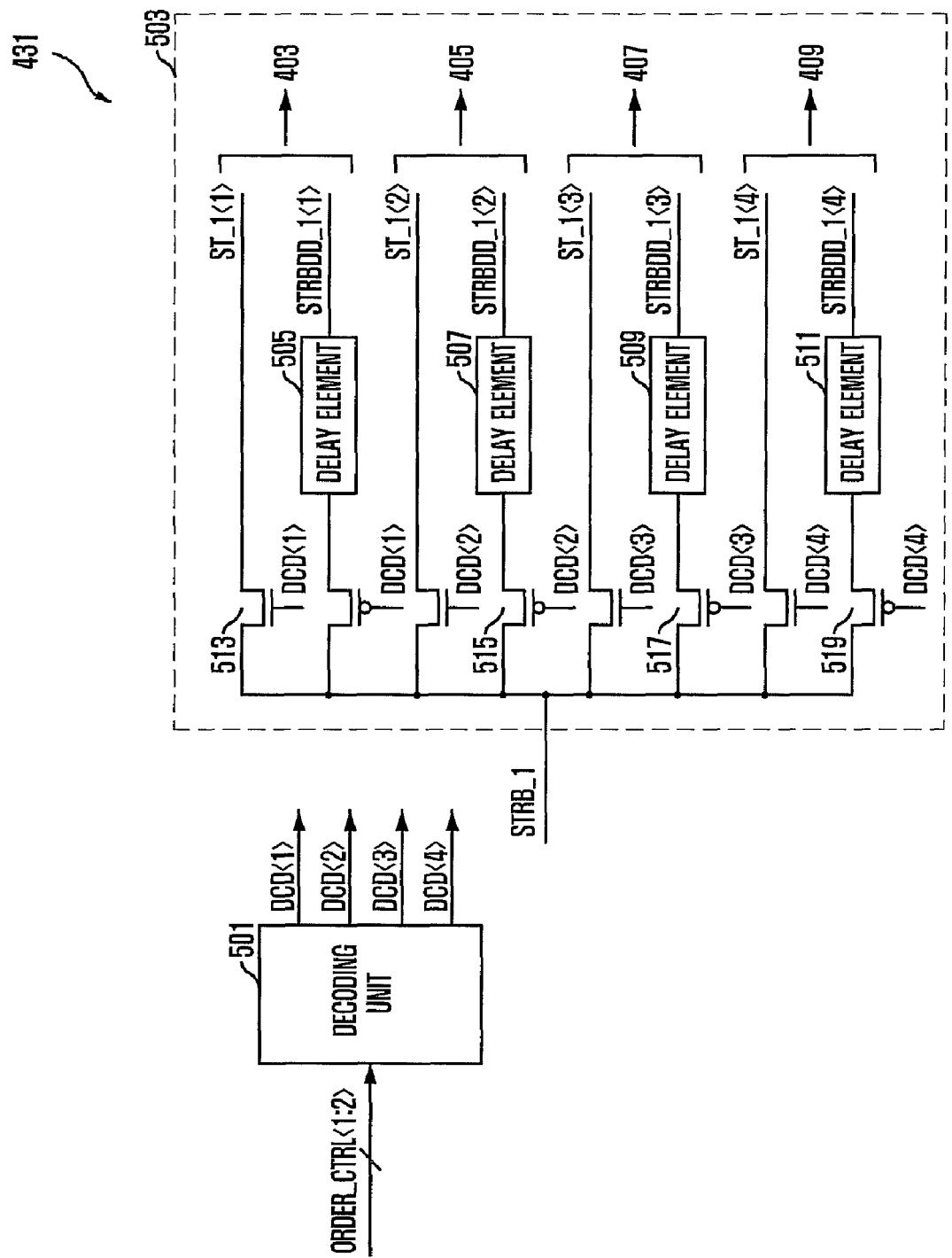
FIG. 5 illustrates a detailed diagram of a strobe signal controlling block described in FIG. 4.

FIG. 5 illustrates a detailed diagram of the strobe signal controlling block 431 described in FIG. 4.

Referring to FIG. 5, the strobe signal controlling block 431 includes a decoding unit 501 and a delay unit 503. FIG. 5 describes only the delay unit 503 delaying the first strobe signal STRB_1. The strobe signal controlling block 431 further includes a delay unit for generating the second strobe signal STRBDD_2<1:4> by delaying the second strobe signal STRB_2. Since a structure of the delay unit for delaying the second strobe signal STRB_2 is similar to that of the delay unit 503 for delaying the first strobe signal STRB_1, the delay unit 503 will be mainly described herein with reference to FIG. 5. The second strobe signal STRB_2 is generated by delaying the first strobe signal STRB_1 through a delay unit, where the delay amount corresponds to a delay amount in the transmission of the second parallel data signals D1 to D4 in response to an application of the first strobe signal STRB_1 from the input/output sense amplifying block 401 to the storing block 411.

The decoding unit 501 decodes a 2-bit output control signal ORDER_CTRL<1:2 > to 4 bits of the second parallel data signals D1 to D4. Hereinafter, in a case that the output control signal ORDER_CTRL<1:2 > is 00, the second parallel data signals D1 to D4 are outputted in order of D1, D2, D3 and D4 in the parallel-to-serial converting block 429, and decoding results DCD<1:4> by the decoding unit 501 become 0001 will be described.

The delaying unit 503 is turned on/off in response to the decoding results DCD<1:4> and includes a plurality of delay elements 505, 507, 509 and 511 that delay the first strobe signal STRB_1 by the second delay amount DD_2. Herein, the turning-on/off of the delay element means that a transistor for transferring the first strobe signal STRB_1 to the delay element is turned on/off. In case the delay elements 505, 507, 509 and 511 are turned off, the delay unit 503 outputs the first strobe control signal ST_1<1:4> having the same enable timing as that of the first strobe signal STRB_1. The first delayed strobe signal STRBDD_1<1:4> and the first strobe control signal ST_1<1:4> respectively generated in response to the decoding results DCD<1:4> are inputted to the input/output sense amplifiers of the input/output sense amplifying block 401.

In the above case, a first NMOS transistor 513 is turned on in response to the decoding result DCD<1> and a first to a third PMOS transistor 515, 517 and 519 are turned on in response to the decoding results DCD<2:4>. Therefore, the first strobe control signal ST_1<1> is inputted to the first input/output sense amplifier 403 and the first input/output sense amplifier 403 outputs the second parallel data signal D1 in response to the first strobe control signal ST_1<1>. The first delayed strobe signals STRBDD_1<2:4> are inputted to the second to the fourth input/output sense amplifiers 405, 407 and 409 and the second to the fourth input/output sense amplifiers 405, 407 and 409 output the second parallel data signals D2 to D4 in response to the first delayed strobe signal STRBDD_1<2:4>.

The delay unit for delaying the second strobe signal STRB_2 generates the second strobe control signal ST_2<1:4> and the second delayed strobe signal STRBDD_2<1:4> in response to the decoding results DCD<1:4> and the storing block 411 stores the second parallel data signals D1 to D4 in response to the second strobe control signal ST_2<1:4> and the second delayed strobe signal STRBDD_2<1:4>.

Figure 6:
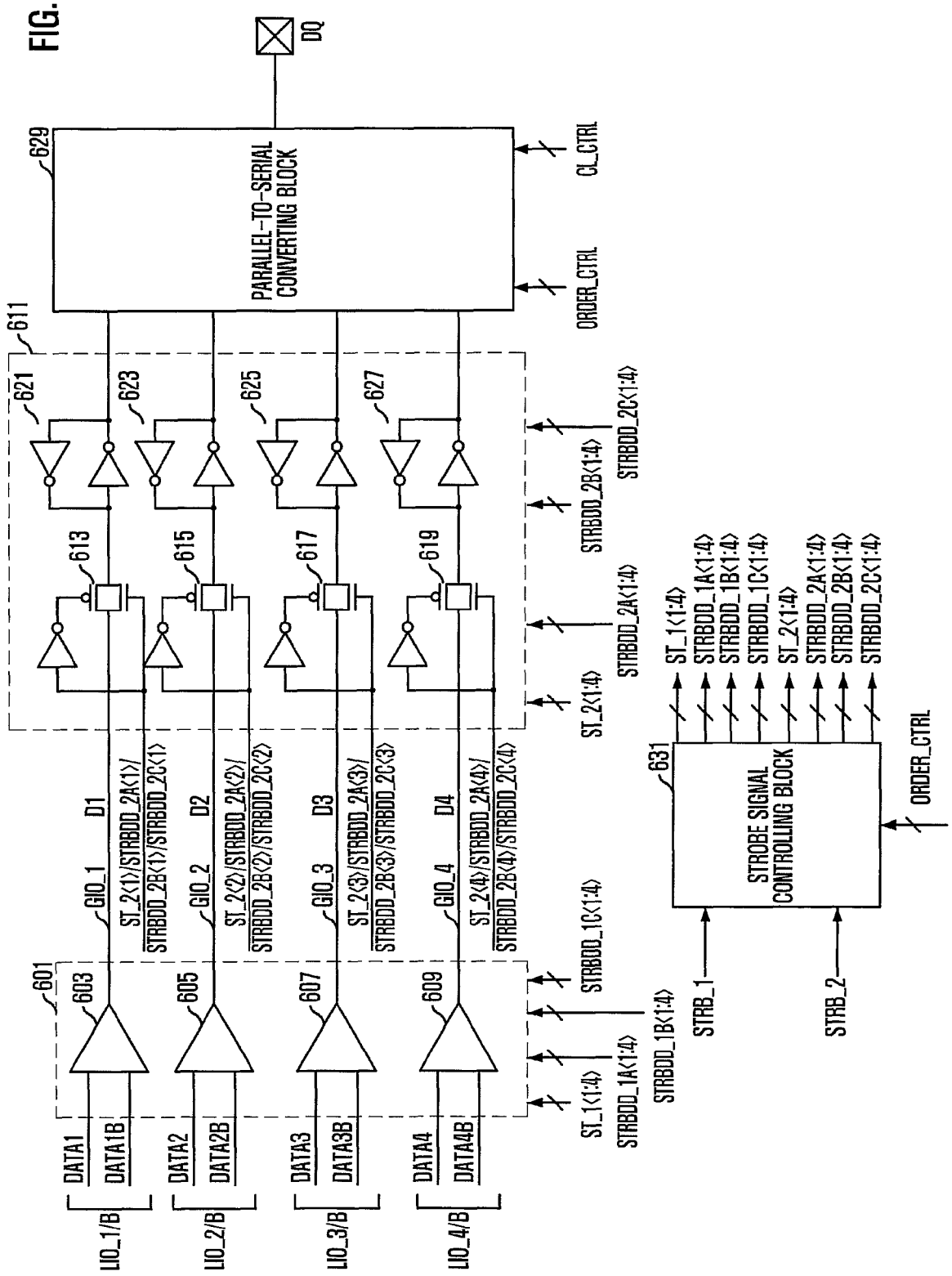
FIG. 6 illustrates a diagram of a data output circuit in accordance with another embodiment of the present invention.

FIG. 6 illustrates a diagram of a data output circuit in accordance with another embodiment of the present invention.

Like the data output circuit described in FIG. 4, the data output circuit illustrated in FIG. 6 includes an input/output sense amplifying block 601, a storing block 611, a parallel-to-serial converting block 629 and a strobe signal controlling block 631. In FIG. 6, a data output circuit of a synchronous semiconductor memory device processing data signals using a 4-bit prefetch scheme will be described as one embodiment of the present invention.

Unlike the strobe signal controlling block 431 described in FIG. 4, the strobe signal controlling block 631 illustrated in FIG. 6 generates first and second strobe control signals ST_1<1:4> and ST_2<1:4> and a plurality of first and second delayed strobe signals STRBDD_1A<1:4>, STRBDD_1B<1:4>, STRBDD_1C<1:4>, STRBDD_2A<1:4>, STRBDD_2B<1:4> and STRBDD_2C<1:4> in response to a first and a second strobe signal STRB_1 and STRB_2.

The enable timing of the first strobe signal STRB_1 is identical to that of the first strobe control signal ST_1<1:4>. Meanwhile, the plurality of first and second delayed strobe signals STRBDD_1A<1:4>, STRBDD_1B<1:4>, STRBDD_1C<1:4>, STRBDD_2A<1:4>, STRBDD_2B<1:4> and STRBDD_2C<1:4> is sequentially enabled as being delayed by the second delay amount DD_2 from the first strobe signal STRB_1. In particular, the first delayed strobe signal STRBDD_1A<1:4> is enabled after being delayed by the second delay amount DD_2 from the first strobe signal STRB_1. The delayed strobe signal STRBDD_1B<1:4> is enabled after being delayed by the second delay amount DD_2 from the delayed strobe signal STRBDD_1A<1:4>. The delayed strobe signal STRBDD_1C<1:4> is enabled after being delayed by the second delay amount DD_2 from the delayed strobe signals STRBDD_1A<1:4>. The second delayed strobe signals STRBDD_2A<1:4>, STRBDD_2B<1:4> and STRBDD_2C<1:4> are also sequentially enabled like the first delayed strobe signals STRBDD_1A<1:4>, STRBDD_1B<1:4> and STRBDD_1C<1:4>.

A first input/output sense amplifier 603 responds to the first strobe control signal ST_1<1> and the first delayed strobe signals STRBDD_1A<1>, STRBDD_1B<1>and STRBDD_1C<1>. A second input/output sense amplifier 605 responds to the first strobe control signal ST_1<2 > and the first delayed strobe signals STRBDD_1A<2>, STRBDD_1B<2> and STRBDD_1C<2>. A third input/output sense amplifier 607 responds to the first strobe control signal ST_1<3> and the first delayed strobe signals STRBDD_1A<3>, STRBDD_1B<3> and STRBDD_1C<3>. A fourth input/output sense amplifier 609 responds to the first strobe control signal ST_1<4> and the first delayed strobe signals STRBDD_1A<4>, STRBDD_1B<4> and STRBDD_1C<4>.

First to fourth pass gates 613, 615, 617 and 619 receive the second strobe control signal ST_2<1:4> and the second delayed strobe signals STRBDD_2A<1:4>, STRBDD_2B<1:4> and STRBDD_2C<1:4> in an order symmetric to the order that the first to the fourth input/output sense amplifiers 603, 605, 607 and 609 receive the first strobe control signal ST_1<1:4> and the first delayed strobe signals STRBDD_1A<1:4>, STRBDD_1B<1:4> and STRBDD_1C<1:4>.

Therefore, second parallel data signals D1 and D2 are sequentially outputted from the input/output sense amplifying block 601 in output timing order of the data signals and the second parallel data signals D1 and D2 are sequentially stored in the storing block 611 in output timing order of the data signals.

Finally, since the inventive data output circuit can prevent the second parallel data signals D1 to D4 from being delayed by the SSN until the second parallel data signals D1 to D4 are transmitted through the global input/output lines GIO_1 to GIO_4 and outputted through the parallel-to-serial converting block 629, an address access time tAA of the synchronous semiconductor memory device can be improved and it is possible to synchronize exact data signals with a clock CLK and output the data signals.

In the meantime, the data output circuit described in FIG. 6 is applicable to any data transmission system using the prefetch scheme like the data output circuit described in FIG. 4, and thus the present invention is applicable to any data output circuit for outputting data according to a preset output order.

Figure 7:
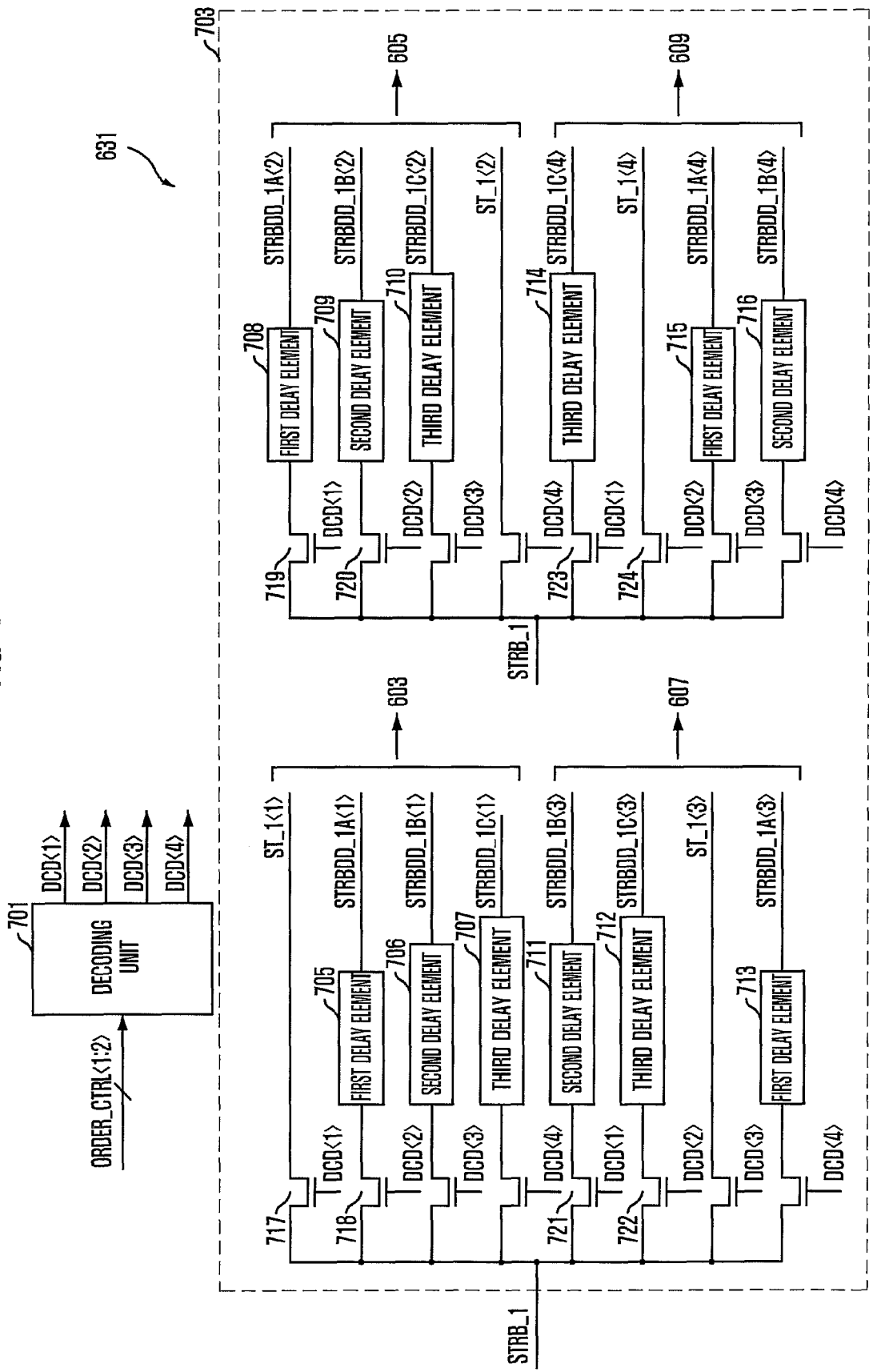
FIG. 7 illustrates a detailed diagram of a strobe signal controlling block described in FIG. 6.

FIG. 7 illustrates a detailed diagram of the strobe signal controlling block 631 described in FIG. 6.

Referring to FIG. 7, the strobe signal controlling block 631 includes a decoding unit 701 and a delay unit 703. FIG. 7 shows only the delay unit 703 for delaying the first strobe signal STRB_1. The strobe signal controlling block 631 further includes a delay unit for generating the second delayed strobe signals STRBDD_2A<1:4>, STRBDD_2B<1:4> and STRBDD_2C<1:4> by delaying the second strobe signal STRB_2. Since a structure of the delay unit for delaying the second strobe signal STRB_2 is similar to that of the delay unit 703 for delaying the first strobe signal STRB_1, the delay unit 703 will be mainly described herein with reference to FIG. 7.

The decoding unit 701 decodes a 2-bit output control signal ORDER_CTRL<1:2 > to 4 bits of the second parallel data signals D1 to D4. Hereinafter, a case where the output control signal ORDER_CTRL<1:2 > is 00, the second parallel data signals D1 to D4 are outputted in order of D1, D2, D3 and D4 in the parallel-to-serial converting block 629, and decoding results DCD<1:4> by the decoding unit 701 become 0001 will be described. Furthermore, a case where the output control signal ORDER_CTRL<1:2 > is 01, the second parallel data signals D1 to D4 are outputted in order of D4, D1, D2 and D3 in the parallel-to-serial converting block 629, and decoding results DCD<1:4> become 0010 will be described.

The delaying unit 703 is turned on/off in response to the decoding results DCD<1:4> and includes a plurality of delay elements 705 to 716 that delays the first strobe signal STRB_1 by integer times of the second delay amount DD_2. The size of each of the delay elements 705 to 716 represents a delay amount. Thus, the delay amount of the first delay elements 705, 708, 713, 715 is the second delay amount DD_2; the delay amount of the second delay elements 706, 709, 711, 716 is two times of the second delay amount DD_2; and the delay amount of the third delay elements 707, 710, 712, 714 is three times of the second delay amount DD_2. In case the delay elements 705 to 716 are turned off, the delay unit 703 outputs the second strobe control signal ST_1<1:4> having the same enable timing as that of the first strobe signal STRB_1.

In case the decoding results DCD<1:4> are 0001 with the lowest to the highest bits corresponding to DCD<1> to DCD<4> in the same order respectively, NMOS transistors 717, 719, 721 and 723 responding to the decoding result DCD<1> are turned on. Therefore, the strobe signal controlling block 631 outputs the first strobe control signal ST_1<1> and the first delayed strobe signals STRBDD_1A<2>, STRBDD_1B<3> and STRBDD_1C<4> that are sequentially enabled.

The first to the fourth input/output sense amplifiers 603, 605, 607 and 609 receive the first strobe control signal ST_1<1> and the first delayed strobe signals STRBDD_1A<2>, STRBDD_1B<3> and STRBDD_1C<4>, respectively, and output the second parallel data signals D1 to D4 in order of D1, D2, D3 and D4.

In case the decoding results DCD<1:4> are 0010 with the lowest to the highest bits corresponding to DCD<1> to DCD<4> in the same order respectively, NMOS transistors 718, 720, 722 and 724 responding to the decoding result DCD<2> are turned on. Therefore, the first strobe control signal ST_1<4> inputted to the fourth input/output sense amplifier 609 and the first delayed strobe signals STRBDD_1A<1>, STRBDD_1B<2> and STRBDD_1C<3> inputted to the first to the third input/output sense amplifiers 603, 605 and 607 are sequentially enabled. The first to the fourth input/output sense amplifiers 603, 605, 607 and 609 output the second parallel data signals D1 to D4 that are enabled in order of D4, D1, D2 and D3.

The delay unit for delaying the second strobe signal STRB_2 generates the second strobe control signal ST_2<1:4> and the second delayed strobe signals STRBDD_2A<1:4>, STRBDD_2B<1:4> and STRBDD_2C<1:4> in response to the decoding results DCD<1:4> and the storing block 611 sequentially stores the second parallel data signals D1 to D4 in response to the second strobe control signal ST_2<1:4> and the second delayed strobe signals STRBDD_2A<1:4>, STRBDD_2B<1:4> and STRBDD_2C<1:4>.

According to a device design method, the bit number of the decoding results DCD<1:4>, a bit combining method, and the disposition of delay elements and transistors receiving the decoding results DCD<1:4> can be changed.

Figure 8A:
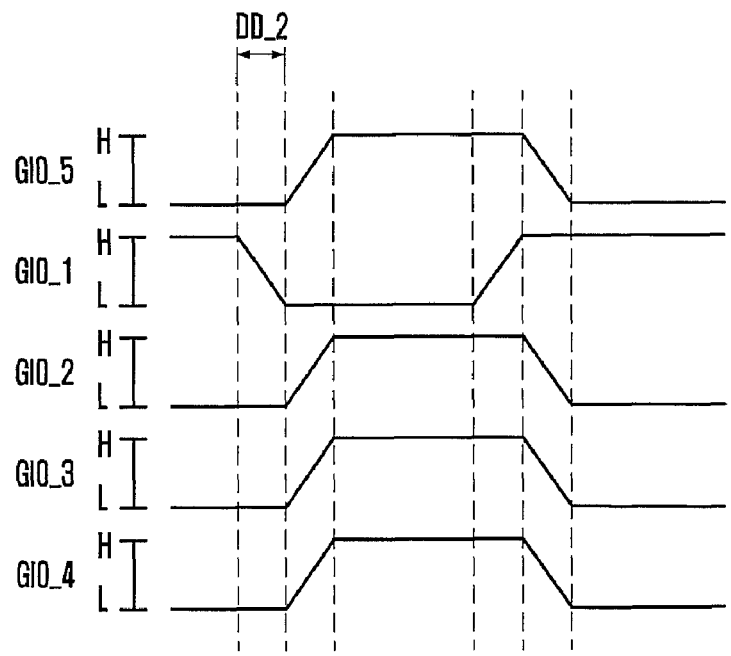
FIGS. 8A and 8B illustrate waveform diagrams of second parallel data signals transmitted through global input/output lines described in FIGS. 4 and 6, respectively.
Figure 8B:
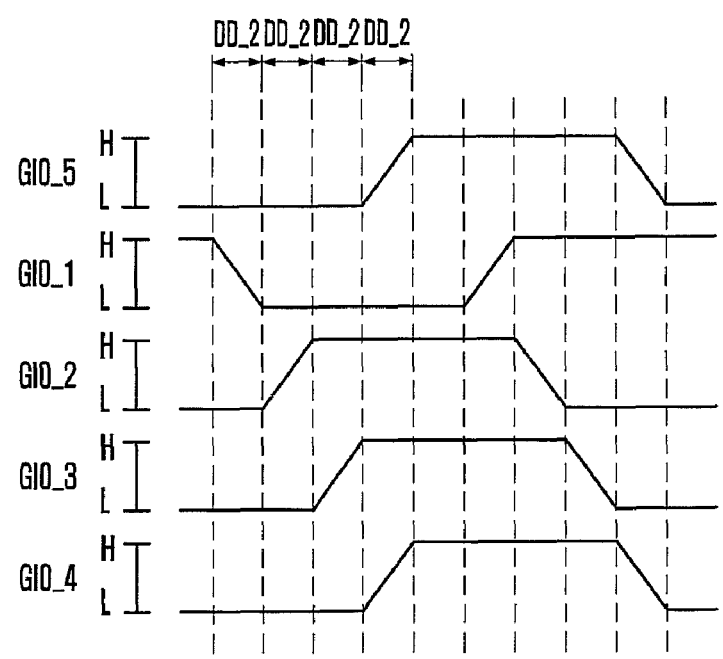

FIGS. 8A and 8B illustrate waveform diagrams of the second parallel data signals transmitted through the global input/output lines described in FIGS. 4 and 6, respectively.

Although FIGS. 4 and 6 show only the 4 global input/output lines GIO_1 to GIO_4, for example, in case a synchronous semiconductor memory device has 16 output pins DQ and processes data using a 4 bit prefetch scheme, the semiconductor memory device includes 16*4 global input/output lines.

In FIG. 8A, the data signals transmitted through the global input/output lines GIO_2 and GIO_5 adjacent to the global input/output line GIO_1 transit from a logic low level to a logic high level after being delayed by the second delay amount DD_2 compared to the data signal transmitted through the global input/output line GIO_1. Therefore, although the data signal transmitted through the global input/output line GIO_1 transits from a logic high level to a logic low level, it is not delayed by the SSN.

In FIG. 8B, the data signals transmitted through the global input/output lines GIO_1 to GIO_4 sequentially transit after being delayed by the second delay amount DD_2. Therefore, although the data signals transmitted through the global input/output lines GIO_2 and GIO_5 adjacent to the global input/output line GIO_1 transit from a logic low level to a logic high level and the data signal transmitted through the global input/output line GIO_1 transits from a logic high level to a logic low level, the data signal transmitted through the global input/output line GIO_1 is not delayed by the SSN.

Figure 2:
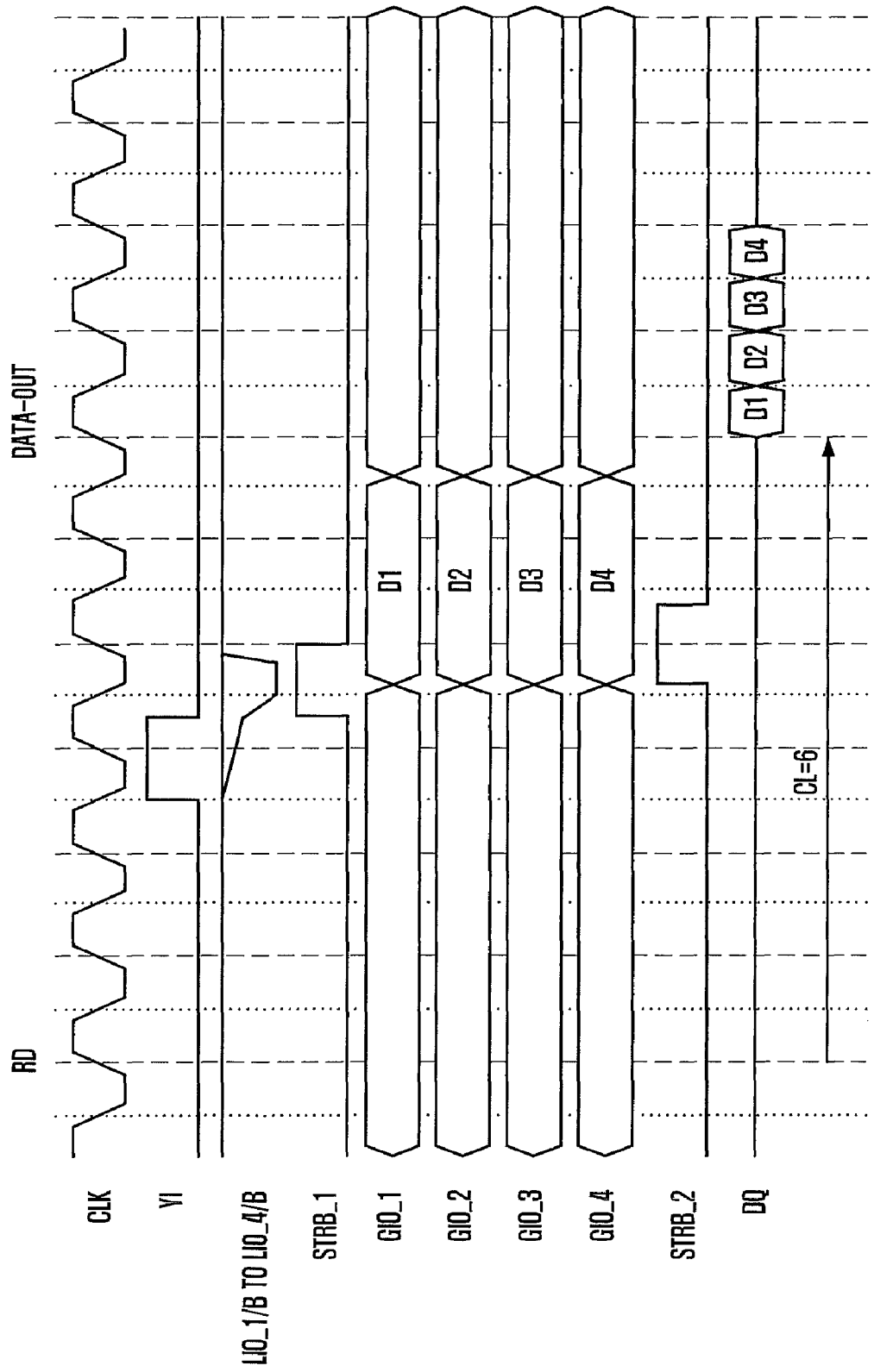
FIG. 2 illustrates a timing diagram of the data output circuit described in FIG. 1.
Figure 3:
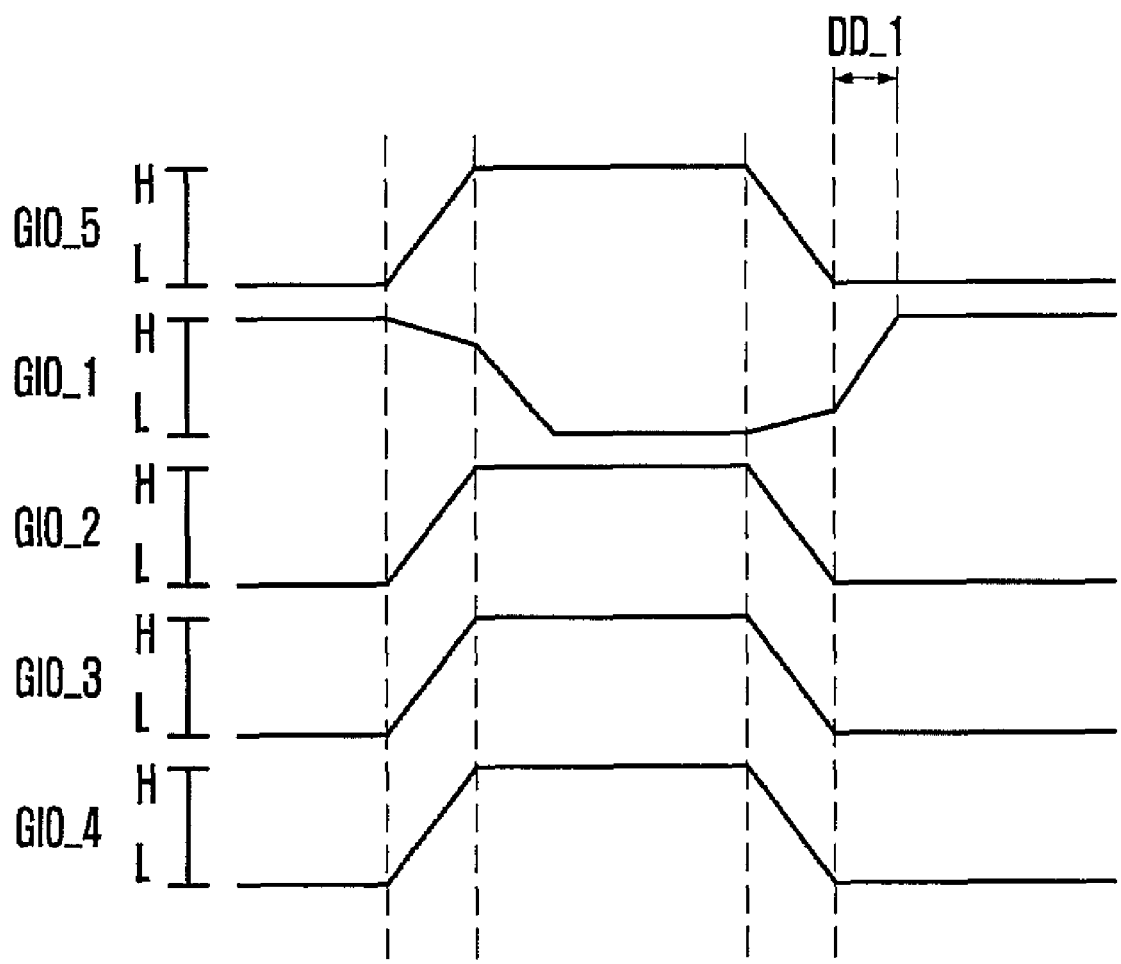
FIG. 3 illustrates a waveform diagram of data signals transmitted through global input/output lines described in FIG. 1.
Figure 9:
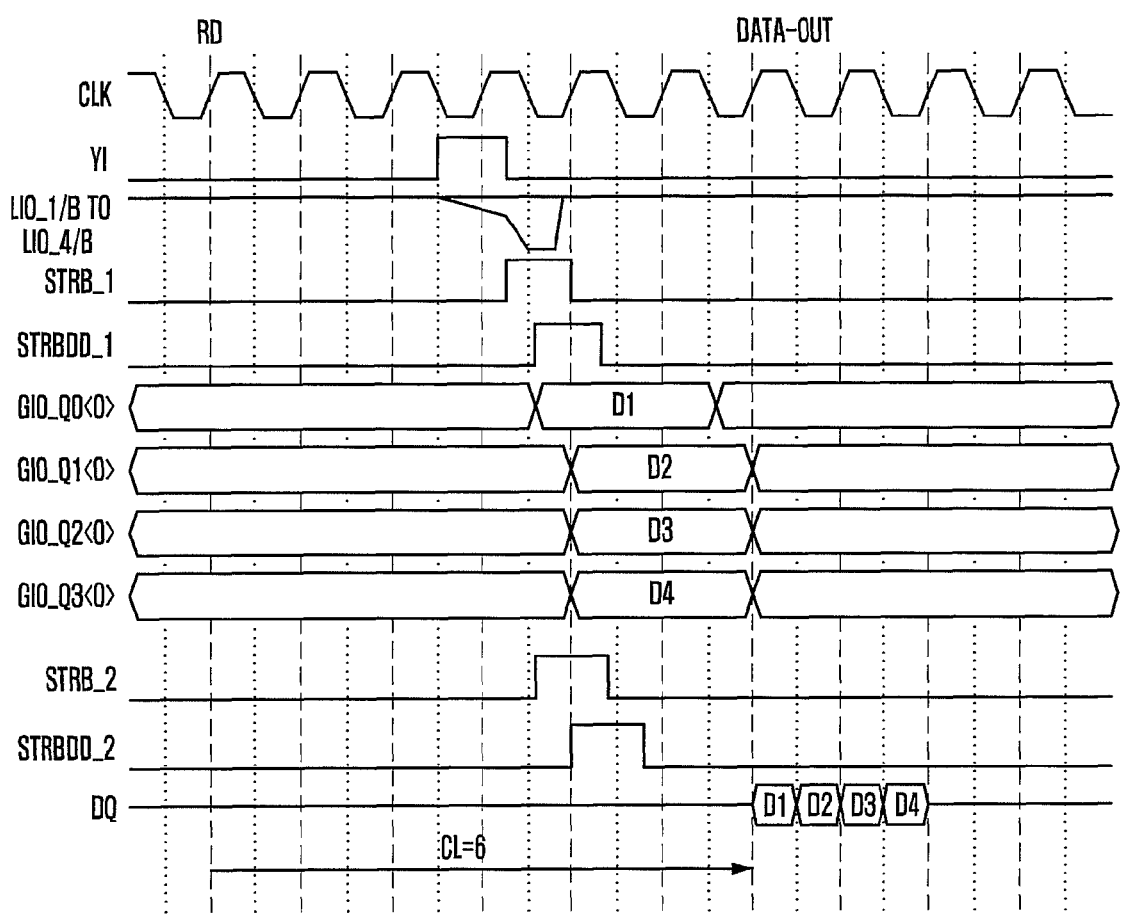
FIG. 9 illustrates a timing diagram of the data output circuit described in FIG. 4.

FIG. 9 illustrates a timing diagram of the data output circuit described in FIG. 4 and it shows a case the CAS latency CL is 6 and the second parallel signals D1 to D4 are outputted in order of D1, D2, D3 and D4 in the parallel-to-serial converting block 429. Since the enable timing of the first and the second strobe signals STRB_1 and STRB_2 is the same as that of the first and the second strobe control signals ST_1 and ST_2, FIG. 9 describes the first and the second strobe signals STRB_1 and STRB_2 for the comparison with FIG. 2.

If the column selection signal YI is enabled after the read command is inputted, a potential difference occurs between the main/sub local input/output lines LIO_1/B to LIO_4/B that are precharged to a logic high level when the first parallel data signals DATA1/B to DATA4/B sensed and amplified at the bit line sense amplifiers are loaded onto the 4 pairs of main/sub local input/output lines LIO_1/B to LIO_4/B. The input/output sense amplifying block 401 senses and amplifies the potential difference between the main/sub local input/output lines LIO_1/B to LIO_4/B in response to the first strobe signal STRB_1 and the first delayed strobe signal STRBDD_1 and outputs the second parallel data signals D1 to D4 delayed by the second delay amount DD_2 onto the global input/output lines GIO_1 to GIO_4.

The storing block 411 latches the second parallel data signals D1 to D4 in response to the second strobe signal STRB_2 and the second delayed strobe signal STRBDD_2. The parallel-to-serial converting block 429 sequentially outputs the second parallel data signals D1 to D4 in order of D1, D2, D3 and D4 after clock cycles corresponding to the CAS latency CL that is 6 in response to the output control signal ORDER_CTRL.

Although the above embodiments are described from a perspective of equipment, an operation of each component constituting the data output circuit in accordance with the present invention can be readily understood from the perspective of process as well. Therefore, the operation of each component constructing the inventive data output circuit can be understood as each step constructing a data output method according to a principle of the present invention. Hereinafter, the data output method will be described with reference to FIGS. 4 to 9.

The first and the second delayed strobe signals STRBDD_1<1:4> and STRBDD_2<1:4> are generated by delaying the first and the second strobe signals STRB_1 and STRB_2 by a certain delay amount according to the order of the data signals determined in response to the output control signal ORDER_CTRL. Then, in response to the first and the second strobe signals STRB_1 and STRB_2 and the first and the second delayed strobe signals STRBDD_1<1:4> and STRBDD_2<1:4>, the first parallel data signals DATA1/B to DATA4/B are amplified and the second parallel data signals D1 to D4 having the same bit number as that of the first parallel data signals DATA1/B to DATA4/B are generated. In response to the first and the second strobe signals STRB_1 and STRB_2 and the first and the second delayed strobe signals STRBDD_1<1:4> and STRBDD_2<1:4>, the second parallel data signals D1 to D4 are latched. The latched second parallel data signals D1 to D4 are sequentially outputted in response to the output control signal ORDER_CTRL.

That is, the first and the second strobe signals STRB_1 and STRB_2 are used to output the data signal first and foremost outputted in the step where the latched second parallel data signals D1 to D4 are sequentially outputted, and the first and the second delayed strobe signals STRBDD_1<1:4> and STRBDD_2<1:4> are used to output the rest of data signals after the first and foremost outputted data signal.

In the step where the first and the second delayed strobe signals STRBDD_1<1:4> and STRBDD_2<1:4> are generated, the output control signal ORDER_CTRL is first decoded to determine the output order of the second parallel data signals D1 to D4. Then, in response to the decoding result, the first and the second strobe signals STRB_1 and STRB_2 are delayed.

In accordance with the embodiments of the present invention, the data output circuit and method transmit the data signals through the data signal transmission lines to have different transmission timings in output order of the data signals. Therefore, the inventive data output circuit and method can prevent the simultaneous switching noise between the data signals, thereby reducing the erroneous operation due to the delay of the data signals and improving the address access time tAA.

While the present invention has been described with respect to the specific embodiments, it will be apparent to those skilled in the art that various changes and modifications may be made without departing from the spirit and scope of the invention as defined in the following claims.

What is claimed is:

1. A data output circuit, comprising:
    a strobe signal controlling block configured to generate at least one first delayed strobe signal by delaying a first strobe signal by a certain delay amount;
    a sense amplifying block configured to amplify first parallel data signals to generate second parallel data signals having the same number of bits as that of the first parallel data signals in response to the first strobe signal and the at least one first delayed strobe signal;
    a storing block configured to latch the second parallel data signals in response to a second strobe signal and a second delayed strobe signal generated by delaying the second strobe signal; and
    a parallel-to-serial converting block configured to sequentially output the second parallel data signals latched in the storing block, wherein the first strobe is used to generate a data signal that is outputted first among the second parallel data signals.

2. The data output circuit of claim 1, wherein the at least one first delayed strobe signal is used to generate all of the second parallel data signals outputted from the parallel-to-serial converting block other than the first-outputted data signal.

3. The data output circuit of claim 1, wherein the certain delay amount is equal to or greater than a width of a transition period of the second parallel data signals.

4. The data output circuit of claim 1, further comprising:
a delay block configured to further delay the first strobe signal to produce the second strobe signal by a delay amount corresponding to an amount of delay at the sense amplifying block in transmitting the second parallel data signals in response to the first strobe signal and the at least one first delayed strobe signal.

5. The data output circuit of claim 1, wherein the storing block comprises:
a plurality of pass gates to be turned on or off in response to the second strobe signal and the second delayed strobe signal; and
a plurality of latching elements for storing signals outputted from the plurality of pass gates.

6. A data output circuit, comprising:
a strobe signal controlling block configured to delay a first strobe signal by a certain delay amount, thereby generating at least one first delayed strobe signal that is sequentially enabled;
a sense amplifying block configured to amplify first parallel data signals to generate second parallel data signals having the same number of bits as that of the first parallel data signals in response to the first strobe signal and the at least one first delayed strobe signal;
a storing block configured to latch the second parallel data signals in response to a second strobe signal and at least one second delayed strobe signal; and
a parallel-to-serial converting block configured to sequentially output the second parallel data signals latched in the storing block in a same order that the second parallel data signals are latched by the storing block.

7. The data output circuit of claim 6, wherein the first strobe signal is used to generate a data signal that is first outputted from the parallel-to-serial converting block among the first parallel data signals and the at least one first delayed strobe signal is used to generate all of the second parallel data signals outputted from the parallel-to-serial converting block other than the first-outputted data signal.

8. The data output circuit of claim 6, wherein the certain delay amount is equal to or greater than a width of a transition period of the second parallel data signals.

9. The data output circuit of claim 6, further comprising:
a delay block configured to further delay the strobe signal to generate the second strobe signal by a delay amount corresponding to an amount of delay at the sensing amplifying block in transmitting the second parallel data signals in response to the first strobe signal and the at least one first delayed strobe signal.

10. The data output circuit of claim 6, wherein the storing block comprises:
a plurality of pass gates to be turned on or off in response to the second strobe signal and the at least one second delayed strobe signal; and
a plurality of latching elements for storing signals outputted from the plurality of pass gates.

11. The data output circuit of claim 1, wherein the at least one first delayed strobe signal comprises a plurality of first delayed strobe signals.

12. The data output circuit of claim 1, wherein the strobe signal controlling block comprises:
a decoding unit configured to decode the output control signal to determine an output order among the second parallel data signals; and
a delay unit including delay elements turned on or off in response to the determination by the decoding unit.

13. The data output circuit of claim 6, wherein the at least one first delayed strobe signal comprises a plurality of first delayed strobe signals.

14. The data output circuit of claim 6, wherein the strobe signal controlling block comprises:
a decoding unit configured to decode the output control signal to determine an output order among the second parallel data signals; and
a delay unit including delay elements turned on or off in response to the determination by the decoding unit.

15. A data output method, comprising:
generating at least one first delayed strobe signal by delaying a first strobe signal by a certain delay amount according to an output order among data signals that is determined in response to an output control signal;
amplifying first parallel data signals in response to the first strobe signal and the at least one first delayed strobe signal, thereby generating second parallel data signals having the same number of bits as that of the first parallel data signals;
latching the second parallel data signals in response to the first strobe signal and the at least one first delayed strobe signal; and
sequentially outputting the latched second parallel data signals in response to the output control signal.

16. The method of claim 15, wherein the first strobe signal is used to generate a data signal that is first outputted among the second parallel data signals and the at least one delayed strobe signal is used to generate all of the data signals of the second parallel data signals other than the first outputted data signal.

17. The method of claim 15, wherein generating the at least one delayed strobe signal comprises:
decoding the output control signal to determine an output order among the second parallel data signals; and
delaying the first strobe signal in response to the determination.

* * * * *